(12) United States Patent
Hayami

(10) Patent No.: US 6,423,904 B1
(45) Date of Patent: Jul. 23, 2002

(54) LAMINATE PRINTED CIRCUIT BOARD WITH LEADS FOR PLATING

(75) Inventor: Keiko Hayami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 815 days.

(21) Appl. No.: 08/760,510

(22) Filed: Dec. 5, 1996

(30) Foreign Application Priority Data

Dec. 6, 1995 (JP) ................................. 7-317689

(51) Int. Cl.⁷ .................................. H05K 1/03

(52) U.S. Cl. ....................... 174/255; 174/265

(58) Field of Search .............. 174/255, 265, 174/262–264

(56) References Cited

U.S. PATENT DOCUMENTS 4,720,915 A    1/1988   Kennedy et al.
5,585,602 A   12/1996   Bernstein

OTHER PUBLICATIONS

IBIDEN Co.,, "Blind Through Holes " (BTH) (published before Dec. 5, 1996).
Tanaka Rare Metal Manufacturing Co.,Ltd., "Multi–Layer High Density Printed Circuit Board", Technologies & Products Guide of Tanaka Rare Metal Group, 9/91.

Primary Examiner—Kamand Cuneo
(74) Attorney, Agent, or Firm—Rabin & Berdo

(57) ABSTRACT

A laminate printed circuit board of the present invention includes wirings respectively extending from terminals provided on the front and rear of the board. The wirings are each connected to an intermediate layer via a respective blind through hole. A wiring provided on the intermediate layer plays the role of a lead for plating. The circuit is capable of reducing a wiring area and noise.

2 Claims, 6 Drawing Sheets

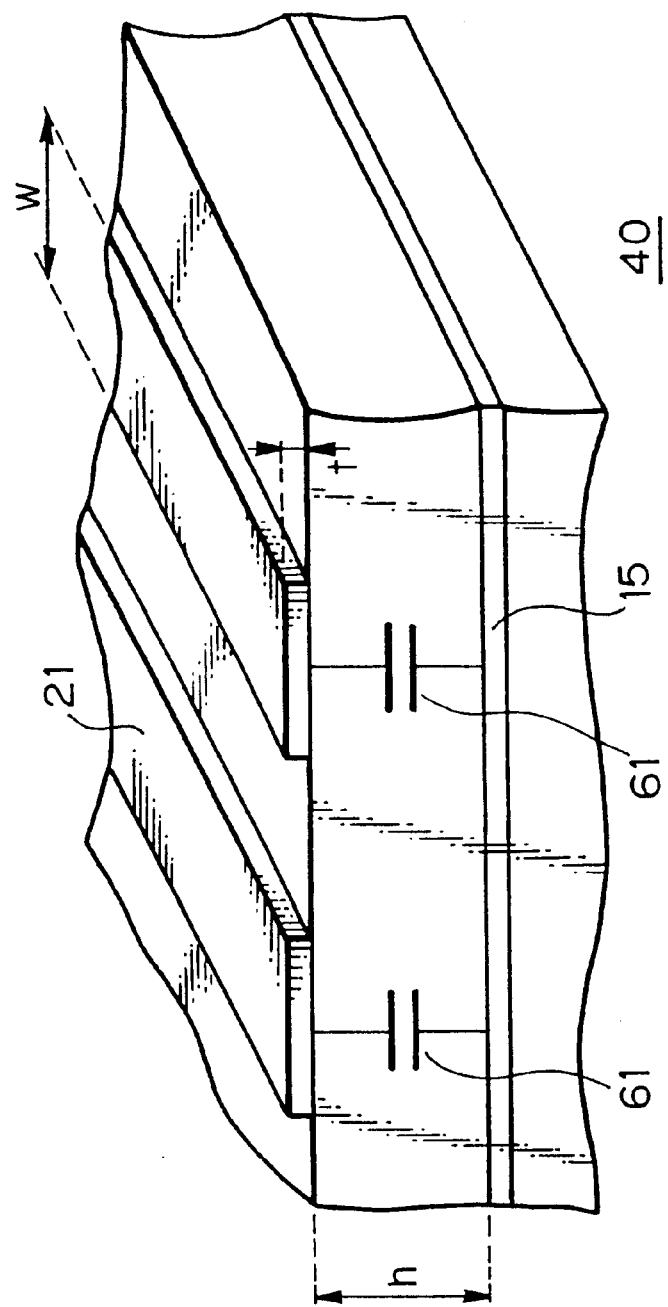

LAMINATE PRINTED CIRCUIT BOARD WITH LEADS FOR PLATING

BACKGROUND OF THE INVENTION

1. Field of the invention

The present invention relates to a laminate printed circuit board having leads for plating.

2. Description of the Background Art

In parallel with a decrease in the size and thickness of memory ICs (Integrated Circuits), memory modules for mounting them are also decreasing in size and thickness. While an SIMM (Single Inline Memory Module) is one of the conventional miniature memory modules, a DIMM (Dual Inline Memory Module) is highlighted today. The SIMM has external terminals arranged on its front and rear surfaces and electrically connected by through via holes. By contrast, in the DIMM, a particular signal flows through each of the front and rear external terminals adjoining each other. The through via holes, or conduction paths, are formed in a laminate printed circuit board in order to provide electrical conduction between different layers. Specifically, the via holes may be formed throughout the circuit board in order to electrically connect the front and rear of the circuit board. Alternatively, the via holes may be so formed as to connect the surface layer of the circuit board and an intermediate layer present in the circuit board, or nearby intermediate layers.

FIGS. 2A and 2B show a specific configuration of the conventional SIMM or DIMM. As shown in FIG. 2A, leads 3 for plating terminals 2 are led out from the end face of the circuit board. This brings about a problem that, as shown in FIG. 2B, when the leads 3 are cut off by a rooter after the plating of the terminals 2, their residuals 4 are deformed and are apt to short-circuit nearby terminals 2. There are also shown in FIGS. 2A and 2B through holes 1 and a side face 5 cut by a rooter.

SUMMARY OF THE INVENTION

It is therefore an object of the present invention to provide a laminate printed circuit board having leads for plating, and capable of eliminating the above problems and reducing the wiring area.

In accordance with the present invention, a laminate printed circuit board includes a conductor provided on each of the front and rear of the circuit board. A wiring is connected to the conductor. A a blind through hole (BTH) is connected to the wiring. A lead for plating forms the intermediate layer of the circuit board and is connected to the BTH. The BTH refers to a through hole for electrically connecting two different layers of the circuit board; at least one of the two layers is an intermediate layer. The BTH therefore does not extend throughout the front and rear of the circuit board. Because the lead forms the intermediate layer, it does not turn out a deformed residual when cut off by a rooter after the plating of the conductor. Further, when the present invention is applied to, e.g., a DIMM, it reduces the wiring area, as will be described hereinafter.

As shown in FIG. 5A, to obviate the deformed residual, leads 6 may be led out by way of through via holes 7 in the case of an SIMM. This kind of scheme, however, is not desirable when it comes to a DIMM for the following reason. As shown in FIG. 5B, in the case of a DIMM, an exclusive through via hole extends from each terminal because the front and rear electrodes are different from each other. As a result, the through via holes are concentrated with twice the density than the via holes of the SIMM in the same area. This makes wiring design difficult or renders the wiring practically impossible.

The present invention is capable of forming, with BTHs, leads for wiring even with a DIMM or similar module in which the front and rear terminals each allows a particular signal to flow. This halves the area of the through holes, compared to the case with the through via holes.

Also, in accordance with the present invention, a laminate printed circuit board includes a plurality of conductors provided on the circuit board and to be plated. A plurality of wirings are respectively connected to the conductors. A plurality of BTHs are respectively connected to the wirings. A lead for plating forms the intermediate layer of the circuit board and connects the BTHs. After the conductors have been plated via the lead, the lead is cut off between nearby BTHs to thereby electrically isolate the nearby BTHs.

Because nearby BTHs are connected at the intermediate layer so as to implement the lead at a time, the lead is prevented from turning out the deformed residuals. As for a DIMM, such a configuration reduces the wiring area. In addition, a vacant portion for accommodating a ground (GND) pattern is available on the intermediate area below the terminal. The GND pattern ensures a constant impedance at the terminals portions wherein signals influence each other in a complicated way, thereby reducing noise.

The impedance at the terminal portions will be described specifically with reference to FIG. 6. As shown, terminals 21 are provided on the surface of a laminate printed circuit board 40 while a GND pattern 15 is formed on an intermediate layer below the terminals 21. Each terminal 21 and ground pattern 15 forms an impedance 61 therebetween. Why the GND pattern ensures a constant impedance is as follows.

Assume that each terminal 21 has a thickness of t and a width of w and is spaced at a distance of h from the GND pattern 15, and that the material intervening between the terminal 21 and the GND pattern 15 has a specific dielectric constant and an effective specific dielectric constant of $\varepsilon_r$ and $\varepsilon_{r\ e}$, respectively. Then, the impedance 61 has a size $Z_o$ expressed as:

$$Z_o = (60/\sqrt{\varepsilon_{re}}) \cdot (\ln(5.98h/(0.8w+t)))$$

As the above equation indicates, the impedance 61 can be maintained constant if the distance h between the terminal 21 and the GND pattern 15 is constant. For example, if the GND pattern 15 is uniformly spaced from the terminals 21, the impedance 61 remains constant. The constant impedance 61 successfully absorbs noise waves and allows a minimum of current causative of malfunction to flow through the terminals 21.

Further, in accordance with the present invention, a laminate printed circuit board includes a plurality of conductors provided on the circuit board and to be plated. A lead for plating connects the conductors. After the conductors have been plated via the lead, the lead is cut off between nearby conductors to thereby electrically isolate the nearby conductors. In this case, a GND area may also be provided in order to maintain the impedance at the terminal portions constant for the above purpose. Moreover, this configuration eliminates the need for BTHs and can be implemented by a conventional simple technology. In addition, because the wirings are formed and cut off on the surface of the circuit board, easy repair is promoted at the stage of visual test.

BRIEF DESCRIPTION OF THE DRAWINGS

The objects and features of the present invention will become more apparent from the consideration of the following detailed description taken in conjunction with the accompanying drawings in which:

FIG. 6 is a view useful for understanding an impedance between terminals and an intermediate layer included in a laminate printed circuit board.

In the figures, identical reference numerals designate identical structural elements.

DESCRIPTION OF THE PREFERRED EMBODIMENTS

Figure 1:
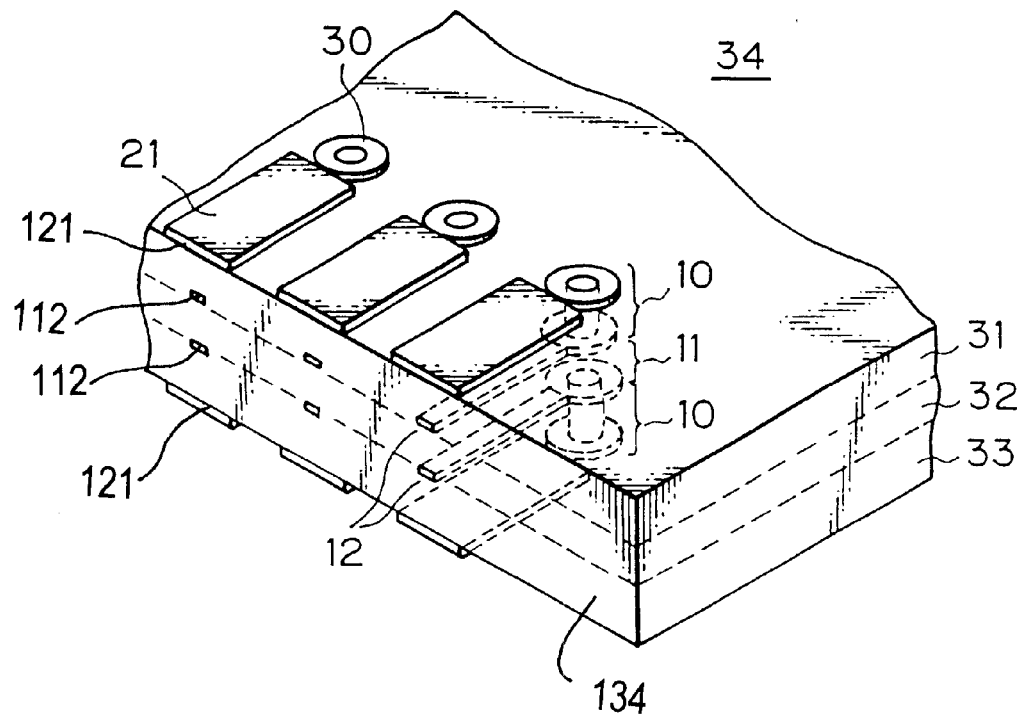
FIG. 1 is a perspective view showing a laminate printed circuit board embodying the present invention and applied to a DIMM.

Referring to FIG. 1 of the drawings, a laminate printed circuit board embodying the present invention is shown. Briefly, the illustrative embodiment uses BTHs to provide a DIMM with leads for plating its terminals. BTHs are an effective implementation for dense wiring because they are capable of constituting through holes only between desired layers, i.e., interlayer via holes. As shown, the laminate printed circuit board, generally 34, has four conductive layers in total and includes a single inner sheet 32 and two outer sheets 31 and 33. The outer sheets 31 and 33 are each formed with BTHs 10. It is to be noted that the circuit board 34 may have any desired number of consecutive sheets so long as it is three or more.

The upper and lower BTHs 10 each allows a particular signal to flow therethrough. An insulating layer 11 intervenes between the upper and lower BTHs 10 and prevents the different signals from interfering with each other, despite that the BTHs 10 are in alignment in the upper-and-lower direction as viewed in FIG. 1. Wirings 30 are respectively led out from front terminals 21 and rear terminals, and each is connected to a particular intermediate layer via the associated BTH 10. The individual intermediate layer is connected to the outside by respective wirings 12 which serve as leads for plating.

Figure 7:
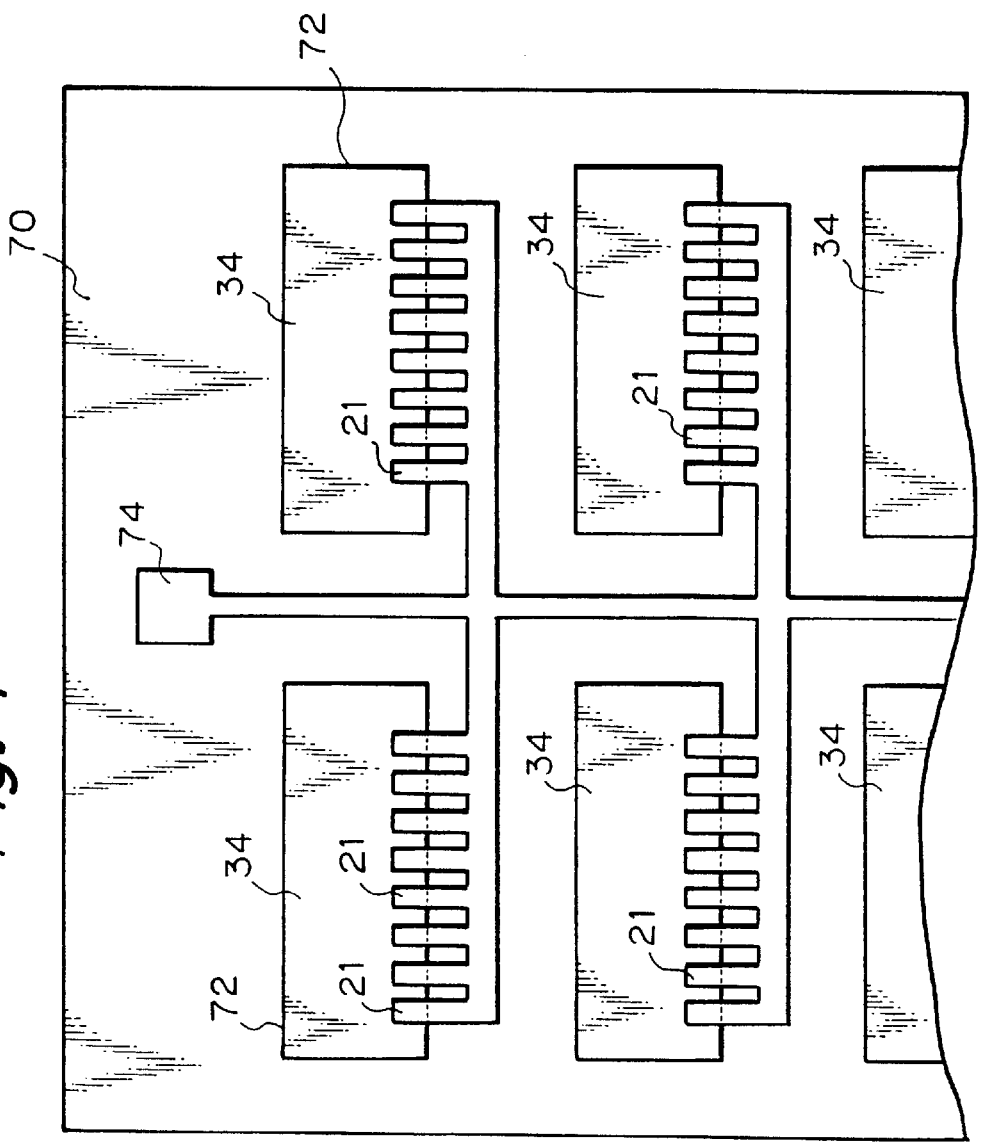
FIG. 7 demonstrates a procedure for producing the circuit board in accordance with the present invention.

A procedure for producing the circuit board 34 of FIG. 1 will be described with reference also being made to FIG. 7. As shown in FIG. 7, in the illustrative embodiment, a plurality of laminate printed circuit boards 34 are formed at the same time on a large plate 70 called a work size. In FIG. 7, the terminals 21 of each circuit board 34 are connected to a pad 74 for plating. After the circuit boards 34 have been put in an electrolytic plating bath, a current is fed via the pad 74. As a result, all the terminals 21 of the circuit boards 34 are plated at the same time. At the final stage of production, the circuit boards 34 are cut away from the plate or work size 70 one by one by a rooter, not shown,: along lines 72. The production procedure will be described more specifically hereinafter.

Referring again to FIG. 1, the sheets 31 and 33 prepared individually for forming the circuit board 34 are each provided with copper foil on its opposite major surfaces by adhesion. The sheets 31 and 33 with the copper foil are individually perforated and then subjected to chemical plating, i.e., electroless plating. As a result, the BTHs 10 are formed in the sheets 31 and 33. Subsequently, a preselected pattern constituting the wirings 12 is formed on the inner or intermediate layer side of each sheet 31 or 33 by, e.g., screen printing or a photographic method. The sheets 31 and 33 are formed of glass epoxy, polyimide or similar material.

The sheets 31 and 33 formed with the BTHs 10 and wirings 12 are put together with the intermediary of the inner sheet, i.e., adhesive sheet or prepreg 32. Then, the three sheets 31–33 are pressed and heated by a heat press and adhered together thereby. The resulting laminate is cured thereafter. Subsequently, through holes, not shown, are formed throughout the three sheets 31–33 by perforation and chemical plating. This is followed by a step of forming the terminals 21 and wiring patterns on the surfaces of the sheets 31 and 33 by, e.g., a photographic process.

The terminals 21 are subjected to electrolytic plating with the wirings 12 serving as leads. The electrolytic plating reinforces the surfaces of the terminals 21 plated previously at the stage shown in FIG. 7, while protecting the terminals 21 from oxidation. For the electrolytic plating, use is made of gold, nickel, solder or similar metal. It is to be noted that a mask for exposing only the portions to be plated is provided and then removed after plating. After the plating, the circuit board 34, as well as the wirings or leads 12, is cut away from the work size 70, FIG. 7, by a rooter. The cutting operation forms, as shown in FIG. 1, cutting surfaces 134, 121 and 112 on circuit board 34, terminals 21 and wirings 12, respectively. As shown, the cutting surfaces 134, 121 and 112 are on the same plane.

As stated above, even with a DIMM causing a particular signal to flow through each of a front and a rear terminal, the illustrative embodiment including the leads connected to the BTHs 10 halves the area of through holes, compared to a circuit board relying on through via holes.

Figure 3A:
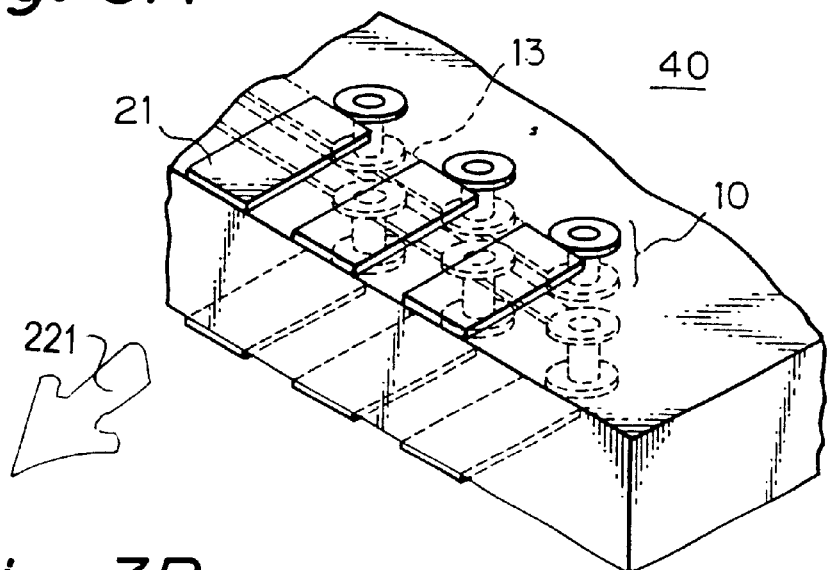
FIGS. 3A, 3B and 3C are perspective views showing an alternative embodiment of the present invention.
Figure 3B:
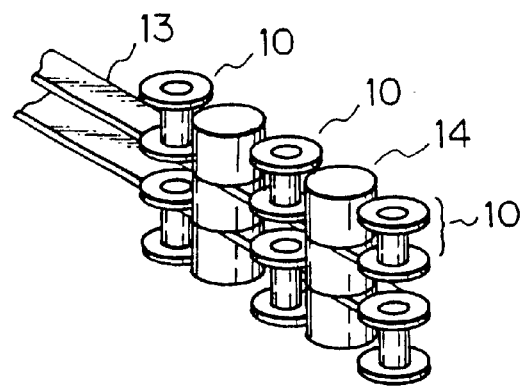
Figure 3C:
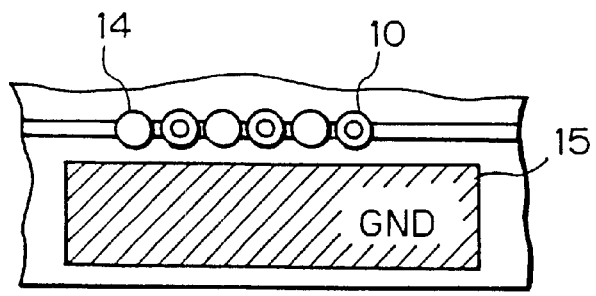

FIGS. 3A–3C show an alternative embodiment of the present invention for a memory module. In the previous embodiment, the leads for plating are led out from the intermediate layers below the terminals 21 by use of the BTHs 10. In this embodiment, as shown in FIG. 3A, a laminate printed circuit board 40 has the terminals 21 formed on each major surface and connected to the respective intermediate layer by the BTHs 10. Each of the terminals 21 extends in a direction 221, i.e., toward an edge of circuit board 40. In addition, the BTHs 10 adjoining each other are interconnected by a wiring 13 sideways at the intermediate layer. That is, the wirings 13 each interconnects the respective array of terminals 21 sideways. The wirings 13 are led out via one side face of the circuit board 40 and play the role of leads for plating, as illustrated. The wiring 13 is shown as extending perpendicular to the direction 221, but may extend in any direction that is different to the direction 221.

As shown in FIG. 3B, after the terminals 21 have been plated, holes 14 are formed in the circuit board 40 from above the wirings 13 by NC (Numerical Control) machining. As a result, nearby terminals 21 having been tied together by the associated wiring 13 are isolated from each other with respect to signals. FIG. 3C shows a pattern provided on the intermediate layer in a perspective view as seen from the top. As shown, because the adjoining BTHs 10 are interconnected sideways, the portion of the intermediate layer below the terminals 21 is vacant. A ground (GND) pattern 15 is arranged in such a vacant portion of the intermediate layer.

The circuit board 40 is produced in substantially the same manner as the circuit board 34, FIG. 1, except for the following. In the previous embodiment, after the electrolytic plating of the terminals 21, the circuit board 34 is cut away together with the leads 12 by the rooter. In this embodiment, the holes 14 are formed in the circuit board 40 before the circuit board 40 is cut away from the work size 70, FIG. 7. The GND pattern 15, FIG. 3C, is formed by a photographic process or similar process at the same time as the wirings 13.

As described above, the circuit board 40 has nearby BTHs 10 interconnected at the intermediate layer, and the leads 13 each interconnecting a plurality of terminals 21 sideways. This allows the GND pattern 15 to be arranged in the vacant portion of t h e intermediate layer available below the terminals 21. The GND pattern 15 ensures a constant impedance at the terminal portions where signals influence each other in an intricate way, thereby reducing noise.

Figure 4A:
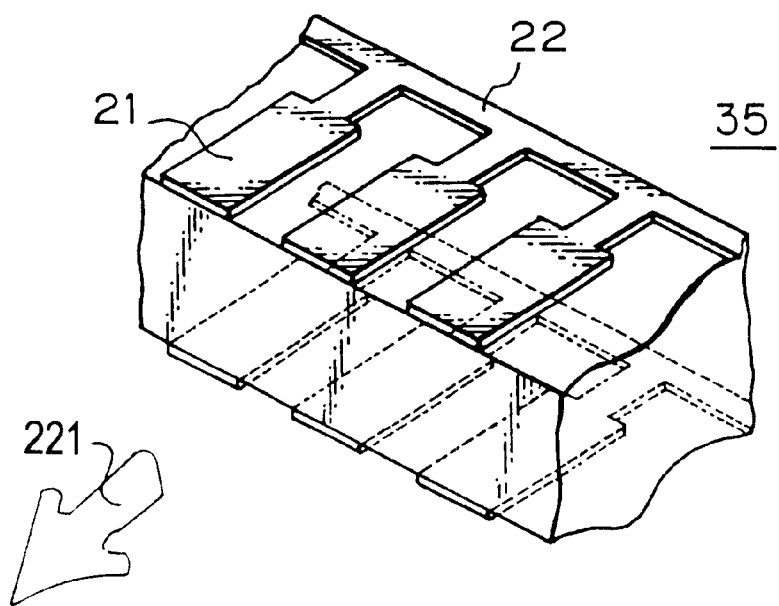
FIGS. 4A AND 4B are perspective views showing another alternative embodiment of the present invention.
Figure 4B:
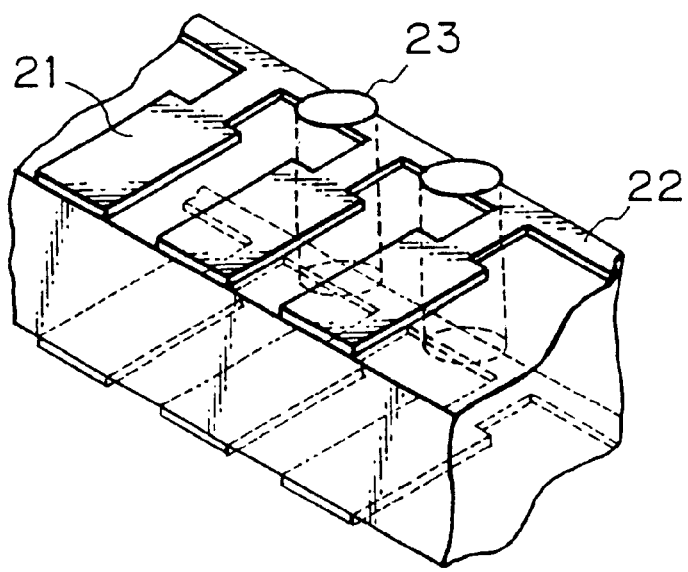
Figure 5A:
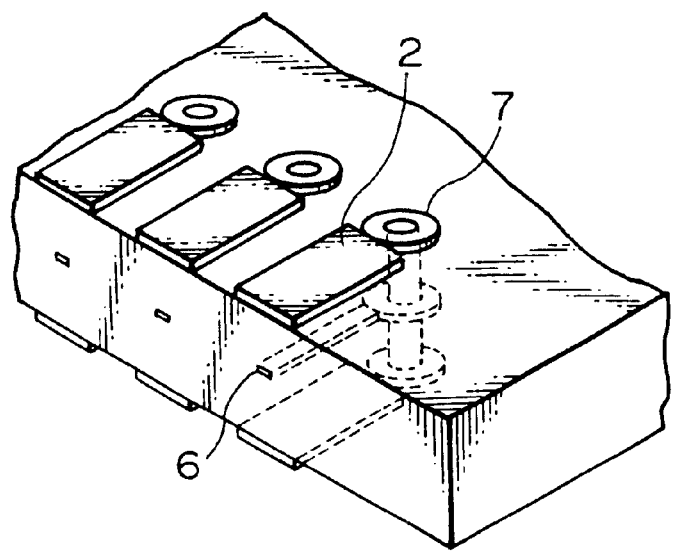
FIGS. 5A and 5B respective show an SIMM and a DIMM in each of which leads for plating are implemented by through via holes.
Figure 5B:
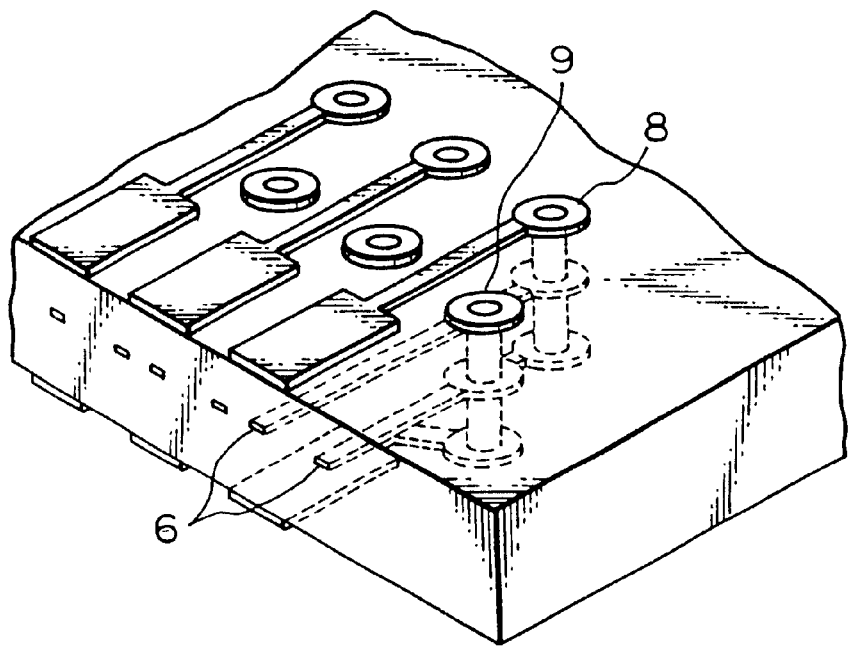

Referring to FIGS. 4A and 4B, another alternative embodiment of the present invention will be described. This embodiment is similar to the embodiment of FIGS. 3A–3C except for the following. As shown in FIG. 4A, a laminate printed circuit board 35 has wirings 22 each interconnecting the respective array of terminals 21 sideways on the surface of the laminate, i.e., without the intermediary of the BTHs 10 of the previous embodiment. Each of the terminals 21 extends in direction 221, which as shown, points toward an edge of circuit board 35. As shown, wiring 22 may extend perpendicular to direction 221, but may also extend in any direction that is different to the direction 221. The wirings 22 play the role of leads at the time of plating.

As shown in FIG. 4B, after the wirings 22 have been plated, holes 23 are formed in the wirings 22 by NC machining so as to isolate nearby terminals 21 with respect to signals. Again, a GND pattern may be formed on the intermediate layer below the terminals 21, as needed. It is to be noted that the circuit board 35 may be implemented as a single-layer printed circuit board in place of a laminate printed circuit board, if desired.

The procedure for producing the circuit board 35 is similar to the conventional procedure up to the step of forming through holes. After the formation of through holes, the wirings 22 are connected to the outside via a pad for plating. In this condition, the terminals 21 are plated via the wirings or leads 22. Thereafter, the circuit board 35 is perforated to form the holes 14 in the wirings 22. It is to be noted that before assembly the GND pattern is formed on the surface of the outer sheet expected to face the inner sheet by, e.g., a photographic process.

This embodiment, like the embodiment shown in FIGS. 3A–3C, ensures a constant impedance at the terminals portions and thereby reduces noise. Further, this embodiment is practicable without resorting to BTHs, and can therefore be produced by a conventional simple technology. In addition, because the wirings 22 are formed and then cut off on the surfaces of the circuit board 35, they are easy to repair at the stage of visual test.

Figure 2A:
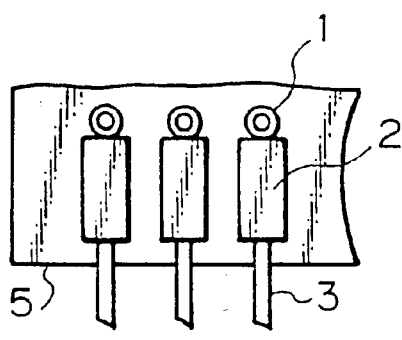
FIGS. 2A and 2B respectively show a conventional SIMM leads in conditions before and after rooter machining.
Figure 2B:
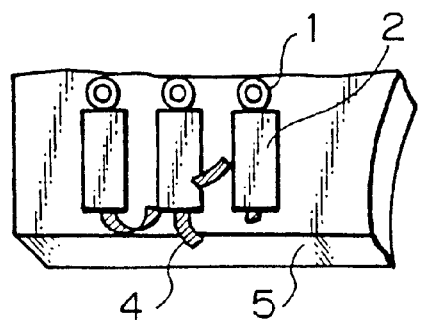

In the embodiments shown and described, while the laminated printed circuit boards are each implemented as a memory module, the present invention is, of course, applicable to other various kinds of electronic circuits. In the embodiments, the signal input/output terminals are assumed to be the conductor to be plated via the leads for plating. Alternatively, a wiring conductor arranged on the laminate printed circuit board may, of course, be plated. The number of layers constituting the circuit board is assumed to be four in FIGS. 1, 2A and 2B or two in FIGS. 3A–3C. If desired, the number of layers may be five, six or more in FIGS. 1, 2A and 2B or three, four or more in FIGS. 3A–3C.

In summary, it will be seen that the present invention provides a laminate printed circuit board capable of forming, with BTHs, leads for plating even on a DIMM in which a particular signal flows through each of the front and rear terminals. The embodiment therefore halves the area of through holes and thereby reduces the wiring area, compared to the structure relying on through via holes. Further, when nearby BTHs are interconnected on an intermediate layer so as to form a plating lead shared by a plurality of terminals, a vacant portion for accommodating a GND pattern is available on the intermediate layer below the terminals. The GND pattern ensures a constant impedance at the terminal portions where signals influence each other in an intricate way, thereby reducing noise. Moreover, the circuit board is practicable even without the BTHs and can be produced by a conventional simple procedure. In addition, because wirings are formed and then cut off on the surfaces of the circuit board, they are easy to repair at the time of a visual test.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A laminate printed circuit board, comprising:

a plurality of plated conductors provided on said laminate printed circuit board, each of said conductors extending in a first direction and toward an edge of said printed circuit board;

a plurality of wirings respectively connected to said plurality of conductors;

a plurality of blind through holes (BTHs) respectively connected to said plurality of wirings; and a lead for plating said plurality of conductors, said lead forming an intermediate layer of said laminate printed circuit board located below said plated conductors, connected to said plurality of BTHs, and extending in a direction different from said first direction;

wherein said lead is severed between nearby ones of said plurality of BTHs so that said nearby BTHs are not interconnected through said lead; and wherein said plurality of conductors are disposed on a common surface of said printed circuit board, wherein the edge of said printed circuit board comprises a first edge, wherein said lead extends toward a second edge of said printed circuit board, and wherein said board has a plurality of holes formed therein, each hole being formed between respective adjacent ones of said plurality of BTHs and extending through said lead so that said adjacent ones of said plurality of BTHs are not interconnected through said lead.

2. A laminate printed circuit board, comprising:

a plurality of plated conductors provided on said laminate printed circuit board, each of said conductors extending in a first direction and toward an edge of said printed circuit board;

an intermediate layer positioned below said plurality of conductors; and a lead for plating said plurality of conductors, said lead being provided on said laminate printed circuit board, connected to said plurality of conductors, and extending in a direction different from said first direction;
wherein said lead is severed between nearby ones of said plurality of conductors so that said nearby conductors are not interconnected through said lead; and
wherein said plurality of conductors are disposed on a common surface of said printed circuit board, wherein the edge of said printed circuit board comprises a first edge, wherein said lead extends toward a second edge of said printed circuit board, and wherein said board has a plurality of holes formed therein, each hole being formed between respective adjacent ones of said plurality of conductors and extending through said lead so that said adjacent ones of said plurality of conductors are not interconnected through said lead.

* * * * *